(12) United States Patent
Altizer

(10) Patent No.: US 7,805,120 B2
(45) Date of Patent: Sep. 28, 2010

(54) NOISE BLANKER CIRCUIT AND METHOD FOR REMOVING NOISE AND CORRECTING A SIGNAL

(75) Inventor: Daniel T. Altizer, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 689 days.

(21) Appl. No.: 11/787,590

(22) Filed: Apr. 17, 2007

(65) Prior Publication Data

US 2008/0261549 A1    Oct. 23, 2008

(51) Int. Cl.
  *H04B 1/10* (2006.01)
(52) U.S. Cl. ................ 455/223; 455/218; 455/225
(58) Field of Classification Search ............ 455/222, 455/223, 224, 225, 218, 219, 220, 221
  See application file for complete search history.

(56) References Cited

U.S. PATENT DOCUMENTS

| | | | | |
|---|---|---|---|---|
| 4,327,446 A * | 4/1982 | Dressler | ............ | 455/223 |
| 5,226,088 A | 7/1993 | Winterer et al. | | |
| 6,347,146 B1 * | 2/2002 | Short et al. | ............ | 381/15 |
| 6,788,923 B2 * | 9/2004 | Tsujishita et al. | ............ | 455/223 |
| 6,810,266 B1 * | 10/2004 | Ecklund et al. | ............ | 455/553.1 |
| 2004/0203551 A1 * | 10/2004 | Li et al. | ............ | 455/296 |

FOREIGN PATENT DOCUMENTS

EP    1 286 473    2/2003

* cited by examiner

*Primary Examiner*—Edward Urban
*Assistant Examiner*—Christian A Hannon
(74) *Attorney, Agent, or Firm*—Jimmy L. Funke

(57) ABSTRACT

A noise blanker circuit and method of removing impulse noise from a signal and correcting the signal is provided. The circuit includes a detection stage, a pulse removal stage, and a pulse removal correction stage. The detection stage includes at least an input that emits an input signal along a first signal path and a second signal path. The first and second signal paths are in communication with a blank pulse generator. The pulse removal stage is in communication with the input and includes at least a sample and hold device that samples and holds the input signal based upon an output of the blank pulse generator. The pulse removal correction stage includes at least a pulse removal device in communication with the detection stage and the pulse removal stage and corrects the input received from the pulse removal stage based upon the output of the blank pulse generator.

18 Claims, 3 Drawing Sheets

NOISE BLANKER CIRCUIT AND METHOD FOR REMOVING NOISE AND CORRECTING A SIGNAL

TECHNICAL FIELD

The present invention is generally directed to the removal of noise from a signal, and more particularly, to a noise blanker circuit and method for removing impulse noise and correcting the signal.

BACKGROUND OF THE INVENTION

Receivers have generally used an impulse noise blanker to reduce the audible effects of impulse noise in a signal, such as direct current (DC) motor noise, or other sources of impulsive electromagnetic interference (EMI). Examples of such receivers are amplitude modulated (AM) receivers and frequency modulated (FM) receivers. Typically, the impulse noise blanker systems include a detection circuit and a removal circuit.

In reference to FIG. 1, one example of a conventional noise blanker circuit is generally shown at reference indicator 10. The noise blanker circuit 10 includes a detection circuit generally indicated at reference indicator 12 and a removal circuit generally indicated at reference indicator 14. The detection circuit 12 has a complex intermediate frequency (IF) input 16 that is separated into a radio frequency (RF) level input 18 and an ultrasonic noise (USN) input 20. A peak-to-average detector 22 is applied to the RF level input 18, and a peak-to-average detector 24 is applied to the USN input 20. If either of the peak-to-average detectors 22,24 detects impulse noise by detecting a large peak-to-average ratio, then the removal circuit 14 is activated in order to remove the impulse noise. Thus, the detection circuit 12 distinguishes impulse noise from the desired signal and other types of noise.

The detection circuit 12 can also include a high-pass filter 26 for the RF level input 18 and a high-pass filter 28 for the USN input 20. Generally, the high-pass filters 26,28 separate all of the noise in the signal from the desired portion of the signal. The peak-to-average detectors 22,24 separate the impulse noise from the other types of noise in the signal. Thus, the detection circuit 12 can detect impulse noise in order to activate the removal circuit 14.

The removal circuit 14 generally includes a delay device 30 and a pulse removal device 32. The delay device 30 is typically used to match in time the input signal from an FM demodulator 34 with the output from a blank pulse generator 36. Thus, the delay device 30 can delay the input signal from the FM demodulator 34 in order to match the processing time of the detection circuit 12 and the output of the blank pulse generator 36. The blank pulse generator 36 outputs a blank pulse when impulse noise is detected. The removal circuit 14 then removes the impulse noise from the signal based upon the output from the blank pulse generator 36 and emits an output.

Typically, impulse noise blanking is generally most effective if there is little or no filtering before the noise blanker circuit 10 because of the inverse relationship between the bandwidth of a filter and the filter's impulse response. Thus, the narrower the bandwidth of the filter, the longer in time the filter's impulse response. By increasing the time of the impulse response of the filter, it is generally more difficult to remove an impulse noise in the output of the filter. Further, algorithms that include variable bandwidth IF filters and channel equalizers result in stretching the impulse noise over time. Additionally, removal of the impulse noise can result in a different type of undesirable audible noise in the signal.

Generally, a sample and hold circuit can be used to remove the impulse noise in a signal when the blanking or removal is performed after the signal is demodulated. Alternatively, when the signal is at IF, and before the signal is demodulated, the impulse noise in a signal can be removed, but an oscillator is usually required to maintain a constant frequency of the signal at IF.

However, receivers have been developed that include an analog-to-digital (A/D) converter at the IF. With the addition of the A/D converter, additional algorithms are required to remove the impulse noise, which typically are difficult and/or costly to implement in an analog receiver. For example, the additional algorithms, in conjunction with the limited bandwidth of the A/D converter, have typically resulted in the noise blanking circuit 10 being inadequate.

Therefore, it is desirable to develop a circuit and method for noise blanking in a digitized system, where the impulse noise can be effectively detected, removed, and corrected.

SUMMARY OF THE INVENTION

According to one aspect of the present invention, a noise blanker circuit provides a detection stage, a pulse removal stage, and a pulse removal correction stage. The detection stage includes at least an input that emits an input signal along a first signal path and a second signal path, wherein the first and second signal paths are in communication with a blank pulse generator. The pulse removal stage is in communication with the input, wherein the pulse removal stage includes at least a sample and hold device that samples and holds the input signal based upon an output of the blank pulse generator. The pulse removal correction stage includes at least a pulse removal device in communication with the detection stage and the pulse removal stage. The pulse removal correction stage corrects the input signal received from the pulse removal stage based upon the output of the blank pulse generator.

According to another aspect of the present invention, a noise blanker circuit provides a detection stage, a pulse removal stage, and a pulse removal correction stage. The detection stage includes at least an input that emits an input signal that is separated into a radio frequency (RF) level input along a first signal path and an ultrasonic noise (USN) input along a second signal path. The first and second signal paths are in communication with a blank pulse generator. The pulse removal stage is in communication with the input, wherein the pulse removal stage includes at least a sample and hold device that samples and holds the input signal based upon an output from the blank pulse generator. The pulse removal correction stage includes at least a pulse removal device in communication with the detection stage and the pulse removal stage. The pulse removal correction stage corrects the input signal received from the pulse removal stage based upon the output of the blank pulse generator using an interpolation technique.

According to yet another aspect of the present invention, a method of removing impulse noise from a signal and correcting the signal includes the steps of detecting an impulse noise in an input signal along a first signal path and a second signal path in a detection stage, and transmitting a blank pulse from a blank pulse generator if the impulse noise is detected. The method further includes the steps of removing the impulse noise from the input signal in the pulse removal stage by sampling and holding the input signal based upon the blank pulse, and correcting the input signal when the impulse noise is removed from the input signal in a pulse removal correction stage.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF A PREFERRED EMBODIMENT

Figure 1:
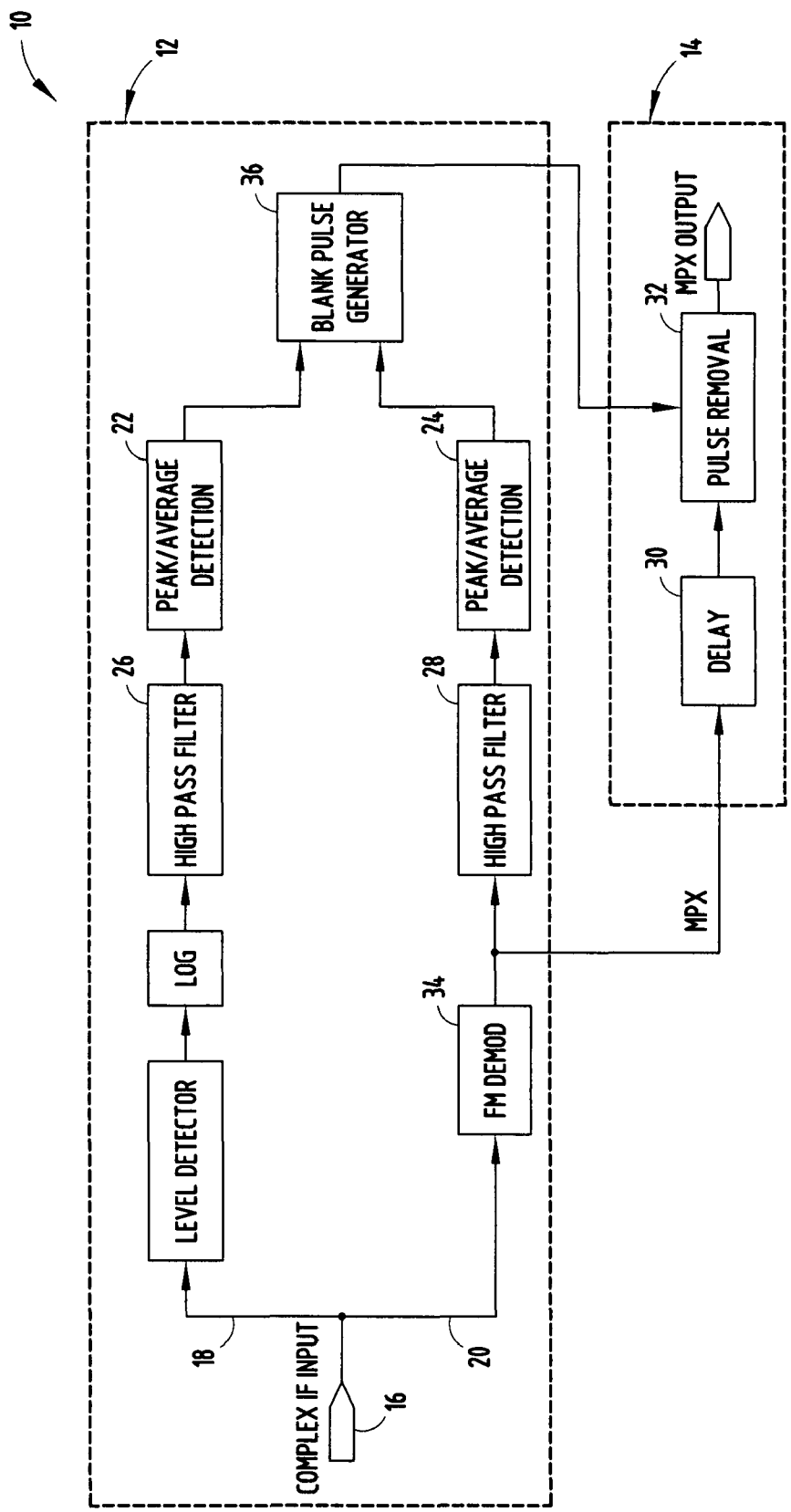
FIG. 1 is a circuit block diagram of a prior art noise blanker circuit.
Figure 2:
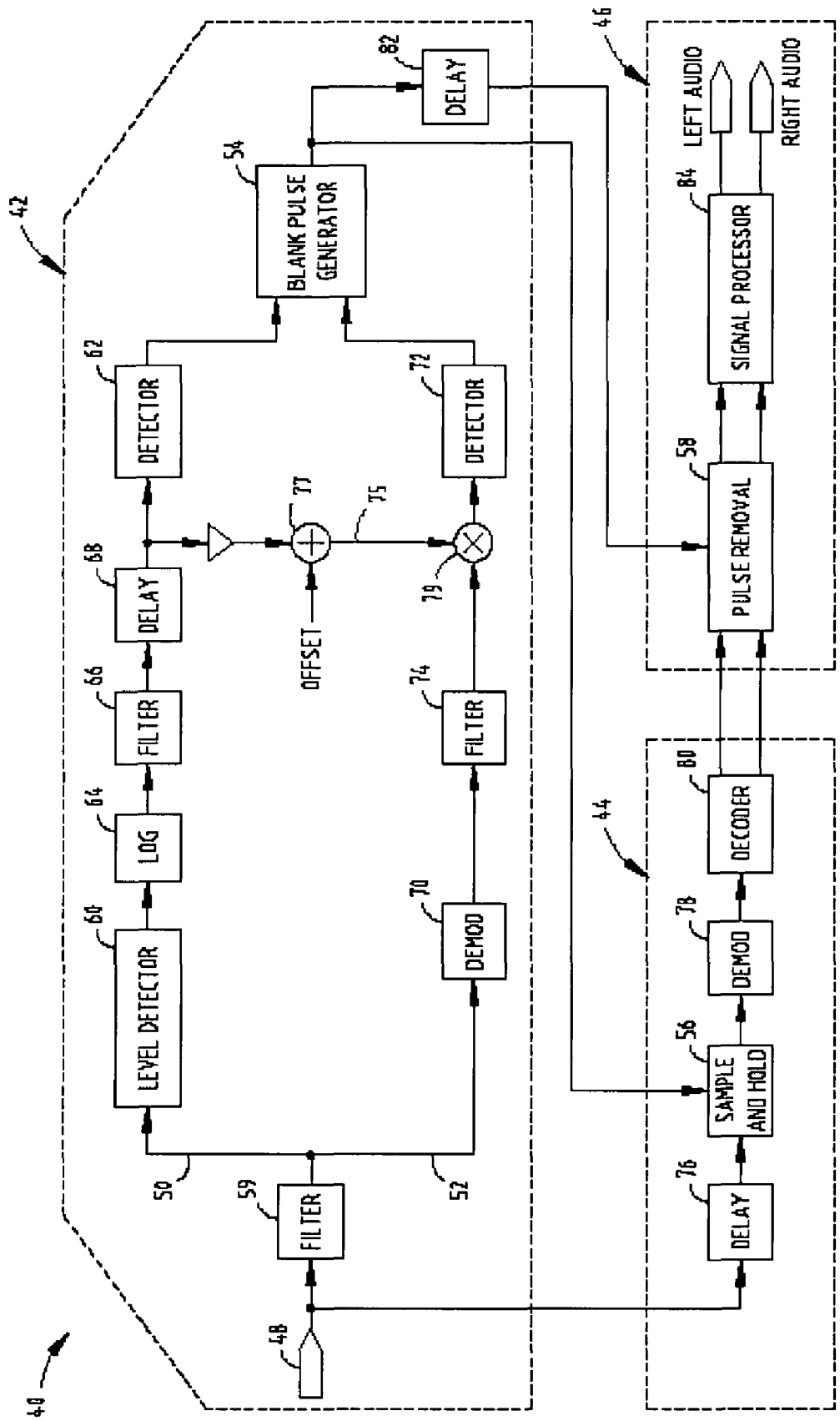
FIG. 2 is a circuit block diagram of a noise blanker circuit in accordance with one embodiment of the present invention.

In reference to FIG. 2, a noise blanker circuit is generally shown in accordance with one embodiment of the present invention at reference indicator 40. The noise blanker circuit 40 generally includes a detection stage generally indicated at reference indicator 42, a pulse removal stage generally indicated at reference indicator 44, and a pulse removal correction stage generally indicated at reference indicator 46. The detection stage 42 includes at least an input 48 that emits an input signal along a first signal path 50 and a second signal path 52 and a blank pulse generator 54. The first signal path 50 and second signal path 52 are in communication with a blank pulse generator 54.

The pulse removal stage 44 is in communication with the input 48. The pulse removal stage 44 includes at least a sample and hold device 56, which samples and holds the input signal from the input 48 based upon an output of the blank pulse generator 54. The pulse removal correction stage 46 includes at least a pulse removal device 58 in communication with the detection stage 42 and the pulse removal stage 44. The pulse removal correction stage 46 corrects the input signal 48 received from the pulse removal stage 44 based upon a blank pulse or an output of the blank pulse generator 54. Typically, the pulse removal device 58 corrects the input signal received from the pulse removal stage 44 by an interpolation technique, as described in greater detail below.

According to one embodiment, the input signal emitted by the input 48 is a complex intermediate frequency (IF) input signal, which is separated into a radio frequency (RF) level input along the first signal path 50 and an ultrasonic noise (USN) input along the second signal path 52. The input signal can be filtered by a filter 59 in communication with the input 48 before being separated into the RF level input and the USN input. The filter 59 is typically a low-pass filter, which reduces the adjacent channel influence in the detection stage 42.

The first signal path 50 can include at least a level detector 60 for amplitude detection of the RF level input and a detector 62 for detecting impulse noise in the RF level input. The first signal path 50 can also include a log device 64 that performs a log function on the output of the level detector 60 for calculation of a percent change, rather than an absolute of change, in order for a more accurate result to be obtained. Thus, the log device 64 normalizes changes in the RF level input, which results in more consistent impulse noise detection across RF levels, than if the log device 64 were not included in the detection stage 42.

The first signal path 50 can also include a filter 66, which is typically a high-pass filter. Thus, the filter 66 can remove the direct current (DC) offset of the RF level input so that the detector 62 has substantially the same operating point regardless of the RF level input. According to one embodiment, the detector 62 is a peak-to-average detector that detects impulse noise by comparing the peak of the impulse noise with the average peak of all the noise signals that are not filtered out by the filter 66. The first signal path 50 can also include a delay device 68 in order to delay the RF level input through the first signal path 50, so that the RF level input from the first signal path 50 is received by the blank pulse generator 54 at the same time as the USN input from the second signal path 52.

The second signal path 52 includes at least a demodulator 70 for demodulating the USN input and a detector 72 for detecting impulse noise in the USN input. According to one embodiment, the demodulator 70 is a frequency modulation (FM) demodulator, and the detector 72 is a peak-to-average detector. The second signal path 52 can also include a filter 74, which typically is a high-pass filter in order to remove substantially all of the audio contents or desirable portion of the USN input so that only the noise remains in the second signal path 52 and is monitored by the detector 72. Thus, the detector 72 separates the impulse noise and all of the remaining noise in the USN input.

The detection stage 42 also includes an offset path 75 where the RF level input is scaled and summed with an offset value by an offset device 77 and then multiplied by a multiplying device 79 with the USN input in the second signal path 52. The scaling and summing of the RF level input with the offset value is used to adjust or alter the multiplication factor that is multiplied to the USN input in order to maximize the effectiveness of a correlation of the USN input, as described in greater detail below.

The pulse removal stage 44 includes at least a delay device 76 for delaying the input signal, a demodulator 78 for demodulating the input signal, and a decoder 80 separating the input signal into two outputs. The delay device 76 is used to delay the input signal received by the sample and hold device 56, so that the input signal is received by the sample and hold device 56 at the same time as the output from the blank pulse generator 54. Typically, the delay device 76 delays the input signal between approximately 25-50 microseconds (μs). The sample and hold device 56 then samples and holds the input signal when the sample and hold device 56 receives an output from the blank pulse generator 54. The pulse removal stage 44 can also include any other desirable signal processing, such as, but not limited to, channel rejection, channel equalizer, the like, or a combination thereof. According to one embodiment, the demodulator 78 is an FM demodulator, and the decoder 80 is a stereo decoder that separates the signal into an L+R (left and right) mono signal and an L−R stereo signal.

The output from the pulse removal stage 44 is received by the pulse removal correction stage 46. The output from the detection stage 42, the blank pulse from the blank pulse generator 54, is delayed by a delay device 82 and received by the pulse removal device 58. Thus, the input signal is corrected in the pulse removal correction stage 46 based upon the output from the blank pulse generator 54. The pulse removal device 58 receives the blank pulse generator 54 in order to perform the correction on the correct part of the signal where the impulse noise was removed. The pulse removal correction stage 46 can also include a signal processing device 84 for processing the L+R mono signal and L−R stereo signal, such as but not limited to, signal de-matrixing or the like.

Typically, an interpolation technique is used to correct the signal, where the signal is sampled around the section of the signal that is removed and the samples are used to estimate what should be inserted into the removed portion of the signal. This is an example of a linear interpolation technique, and it should be appreciated by those skilled in the art that higher order interpolation techniques can also be used to correct the signal. Alternatively, a filter can be used in order to fill the missing sample or portion of the signal that is removed.

Figure 3:
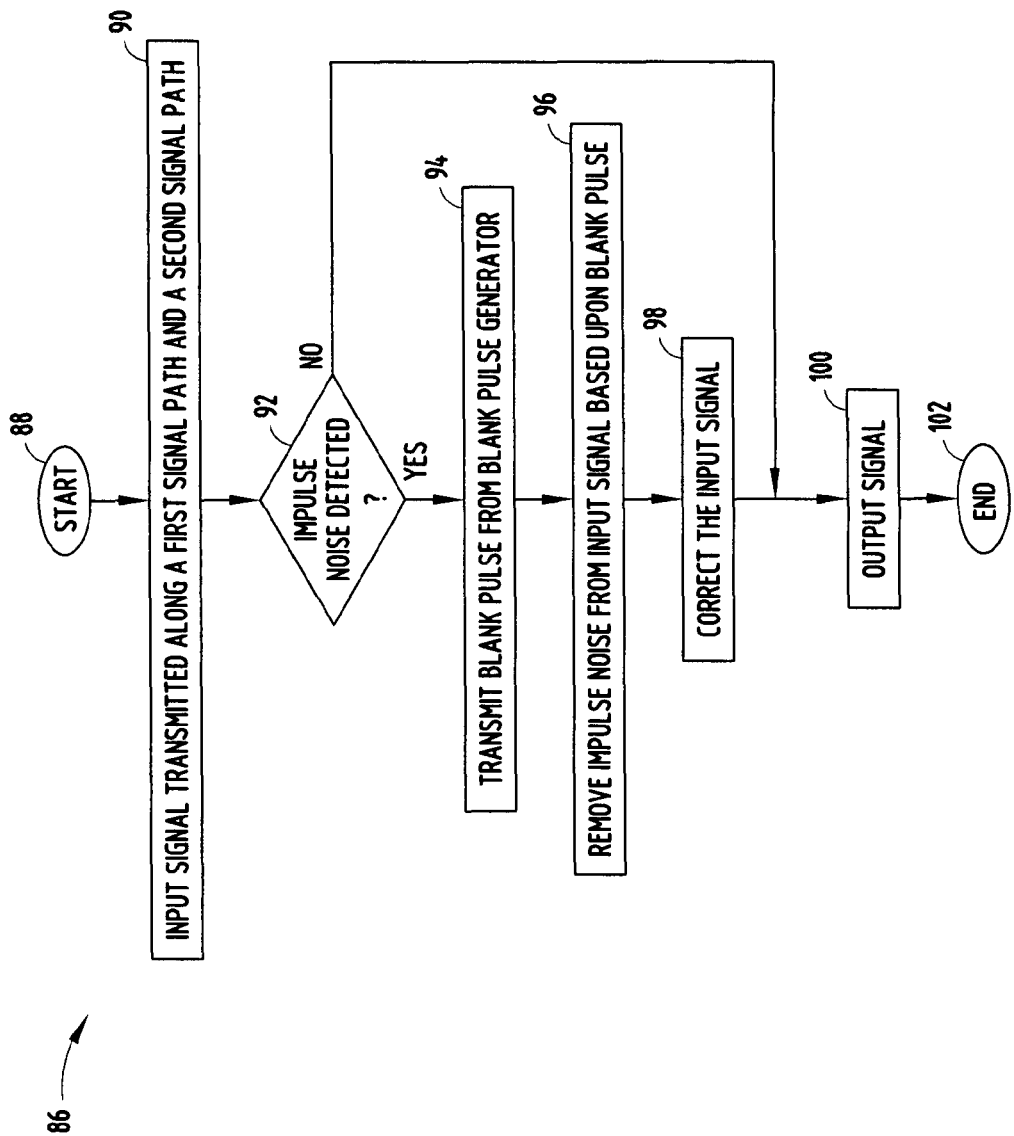
FIG. 3 is a flow chart illustrating a method of removing an impulse noise from a signal and correcting the signal in accordance with one embodiment of the present invention.

In reference to both FIGS. 2 and 3, a method of removing impulse noise and correcting a signal is generally shown in FIG. 3 at reference indicator 86. The method 86 starts at step 88 and proceeds to step 90, where an input signal is transmitted along a first signal path 50 and a second signal path 52. At decision step 92, it is determined if an impulse noise is detected in the signal.

If it is determined that an impulse noise is detected at decision step 92, the method 86 proceeds to step 94, where a blank pulse from the blank pulse generator 54 is transmitted. At step 96, the impulse noise is removed from the input signal 48 based upon the output of the blank pulse generator 54. At step 98, the input signal 48 is corrected. According to one embodiment, an interpolation technique is used to correct the signal, as described above. Alternatively, a filter can be used to correct the signal, as described above. The noise blanker circuit 40 then outputs an output signal at step 100.

However, if it is determined that an impulse signal is not detected at decision step 92, the method 86 proceeds to step 100, where the noise blanker circuit 40 outputs an output signal. The method 86 thereafter ends at step 102.

By way of explanation and not limitation, in operation, the noise blanker circuit 40 can be placed before one or more algorithms that may potentially stretch the impulse signal in order to prevent the difficulties created by removing an impulse noise that is stretched over time. However, by placing the noise blanker circuit 40 in such a location, such as prior to filtering, the possibility of adjacent channel interference and IF blanking resulting in the blank pulse generator 54 emitting a blank pulse at an undesirable time increases. Thus, the adjacent channel interference and IF blanking can result in the blank pulse generator 54 emitting a blank pulse when the detectors 62,72 do not detect an impulse noise. In order to reduce the adjacent channel interference on the noise blanker circuit 40, the filter 59 can be placed before the input signal 48 is separated into the RF level input along the first signal path 50 and the USN input along the second signal path 52.

Generally, IF blanking or removing the impulse noise before demodulating the signal can result, requiring a complex blanking or removing algorithm in order to remove the impulse noise. The complex blanking or removing algorithm can require a high sample rate. Thus, the noise blanker circuit 40 uses a block processing approach, such that when an impulse noise is detected, an entire block of the signal is removed instead of the individual sample. This reduces the amount of signal processing required and allows the detection stage 42 and pulse removal stage 44 to operate at a fraction of the operating time when compared to systems where individual samples are removed. Further, the detection circuit 42 can operate with the maximum received signal strength indicator (RSSI) and multiplex (MPX) for each block.

Typically, the sample and hold device 56, which is used to sample and hold the input signal 48, causes the output of the demodulator 78 to go to zero for the duration of the hold. The output goes to zero because a hold on the input signal 48 keeps a constant phase, which is a frequency of zero, since frequency is the derivative of the phase. Thus, the output of the blank pulse generator 54 is sent to the pulse removal correction stage 46, which is after the demodulator 78. The pulse removal correction stage 46 can utilize any suitable type of removal to correct the zero output created by the detection stage 42 and pulse removal stage 44.

Further, the correlation technique can be used to separate the impulse noise from other noise in the second signal path 52. Since the RF level input in the first signal path 50 increases during the duration of the impulse noise when the impulse noise magnitude is greater than the magnitude of the desired signal and/or the impulse noise has a long duration compared to the period of the input signal, a positive correlation can be calculated between the RF level input in the first signal path 50 and the USN input in the second signal path 52. Using the correlation technique or multiplying the RF level input with the USN input allows the effect of the impulse noise in the USN input to be extracted during the time of the impulse noise. Additionally, the correlation technique can suppress other types of noise in the USN input when impulse noise is not present in the USN input.

According to one embodiment, the noise blanker circuit 40 is used in a radio and removes and corrects frequency modulated (FM) signals. Additionally, the radio can be used in a vehicle, which typically results in the radio being operated in a noisy environment with respect to impulse noise and electromagnetic interference (EMI). For example purposes only, and in no way limiting, the impulse noise can be created by the ignition system of the vehicle. However, it should be appreciated by those skilled in the art that the noise blanker circuit 40 can be used to remove noise and correct the signal in radios that are not mounted in a vehicle.

Advantageously, the noise blanker circuit 40 and method 86 can adequately remove the impulse noise from a signal and correct the signal for outputting an audio output within the limited bandwidth and to prevent the impulse noise stretching. Thus, the noise blanker circuit 40 and method 86 can be used to remove impulse noise in order to reduce the audible affects in receivers that include A/D converters. Also, the removal of the impulse noise is corrected so that the portion of the signal that is removed, which contained the impulse noise, does not create an undesirable audible affect.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A noise blanker circuit comprising:
 a detection stage comprising an input that emits a signal along a first signal path and a second signal path, wherein said first and second signal paths are in communication with a blank pulse generator;
 a pulse removal stage in communication with said input, wherein said pulse removal stage comprises a sample and hold device that samples and holds said input signal based upon an output of said blank pulse generator; and
 a pulse removal correction stage comprising a pulse removal device in communication with said detection stage and said pulse removal stage, wherein said pulse removal correction stage corrects said input signal received from said pulse removal stage based upon said output of said blank pulse generator, wherein said pulse removal stage further comprises a delay device for delaying said input signal, a demodulator for demodulating said input signal, and a decoder for separating said input signal into two audio outputs.

2. The circuit of claim 1, wherein said pulse removal device corrects said input signal received from said pulse removal stage by one of an interpolation technique and a filter.

3. The circuit of claim 1, wherein said input signal is separated, and a radio frequency (RF) level input is transmitted along said first signal path, and an ultrasonic noise (USN) input is transmitted along said second signal path.

4. The circuit of claim 1, wherein said first signal path comprises a level detector for amplitude detection of said input signal and a detector for detecting impulse noise in said input signal.

5. The circuit of claim 4, wherein said detector is a peak to-average detector.

6. The circuit of claim 1, wherein said detection stage further comprises an offset path, wherein said signal in said first signal path is scaled and multiplied with said signal in the second signal path.

7. The circuit of claim 1, wherein said second signal path comprises a demodulator for demodulating said input signal and a detector for detecting impulse noise in said input signal.

8. The circuit of claim 7, wherein said detector is a peak to-average detector.

9. The circuit of claim 1, wherein said pulse removal correction stage further comprises a weak signal processing device.

10. A noise blanker circuit comprising:
    a detection stage comprising an input that emits an input signal that is separated into a radio frequency (RF) level input along a first signal path and an ultrasonic noise (USN) input along a second signal path and an offset path, such that said RF level input is scaled and multiplied with said USN input, wherein said first and second signal paths are in communication with a blank pulse generator;
    a pulse removal stage in communication with said input, wherein said pulse removal stage comprises a sample and hold device that samples and holds said input signal based upon an output from said blank pulse generator; and
    a pulse removal correction stage comprising a pulse removal device in communication with said detection stage and said pulse removal stage, wherein said pulse removal correction stage corrects said input signal received from said pulse removal stage based upon said output of said blank pulse generator using an interpolation technique.

11. The circuit of claim 10, wherein said first signal path comprises a level detector for amplitude detection of said RF level input and a peak-to-average detector for detecting impulse noise in said RF level input.

12. The circuit of claim 10, wherein said second signal path comprises a demodulator for demodulating said USN input and a peak to-average detector for detecting impulse noise in said USN input.

13. The circuit of claim 10, wherein said pulse removal stage further comprises a delay for delaying said input signal, a demodulator for demodulating said input signal, and a decoder for separating said input signal into two outputs.

14. The circuit of claim 10, wherein said pulse removal correction circuit further comprises a weak signal processing device.

15. A method of removing impulse noise and correcting a signal, said method comprising the steps of:
    detecting an impulse noise in an input signal along a first signal path and a second signal path in a detection stage;
    transmitting a blank pulse from a blank pulse generator if said impulse noise is detected;
    removing said impulse noise from said input signal in a pulse removal stage by sampling and holding said input signal based up said blank pulse; and
    correcting said input signal when said impulse noise is removed from said input signal in a pulse removal correction stage,
    wherein said input signal is corrected using an interpolation technique in said pulse removal correction stage.

16. The method of claim 15 further comprising the step of delaying said output from said blank pulse generator received by said pulse removal correction stage.

17. The method of claim 15 further comprising the step of delaying said input signal received by said pulse removal stage.

18. The method of claim 15 further comprising the step of scaling and multiplying said signal in said first signal path with said signal in said second signal path in an offset path.

* * * * *